United States Patent
Mang et al.

(10) Patent No.: US 7,469,392 B2
(45) Date of Patent: Dec. 23, 2008

(54) ABSTRACTION REFINEMENT USING CONTROLLABILITY AND COOPERATIVENESS ANALYSIS

(75) Inventors: Yiu Chung Mang, Toronto (CA); Pei-Hsin Ho, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 404 days.

(21) Appl. No.: 11/298,120

(22) Filed: Dec. 8, 2005

(65) Prior Publication Data

US 2006/0129959 A1 Jun. 15, 2006

Related U.S. Application Data

(60) Provisional application No. 60/634,671, filed on Dec. 9, 2004.

(51) Int. Cl.
*G06F 17/50* (2006.01)
(52) U.S. Cl. .............................. 716/5; 716/4
(58) Field of Classification Search ................ 716/4–5; 703/2, 14–15
See application file for complete search history.

(56) References Cited

U.S. PATENT DOCUMENTS

| | | | |
|---|---|---|---|
| 6,691,078 B1 * | 2/2004 | Beer et al. ................. | 703/14 |
| 7,065,726 B1 * | 6/2006 | Singhal et al. ............. | 716/5 |
| 7,159,198 B1 * | 1/2007 | Ip et al. .................... | 716/5 |
| 2003/0225552 A1 * | 12/2003 | Ganai et al. ............... | 703/2 |
| 2004/0123254 A1 * | 6/2004 | Geist et al. ................ | 716/4 |
| 2004/0153983 A1 * | 8/2004 | McMillan .................. | 716/5 |
| 2004/0230407 A1 * | 11/2004 | Gupta et al. ............... | 703/2 |

* cited by examiner

*Primary Examiner*—Paul Dinh
(74) *Attorney, Agent, or Firm*—Park, Vaughan & Fleming LLP

(57) ABSTRACT

One embodiment of the present invention provides a system that refines an abstract model. Note that abstraction refinement is commonly used in formal property verification. During operation, the system receives an abstract model which is a subset of a logic design which can be represented using a set of variables and a set of Boolean functions. Next, the system receives a safety property for the logic design which is desired to be proven. The system also receives a set of counter-examples. A counter-example is a sequence of states that violates the safety property. Note that a state is an assignment of values to the variables, which are determined using the set of Boolean functions and the variable values in the previous state. The system then determines a set of cooperative variables using the set of counter-examples. A cooperative variable is a variable that can help invalidate all counter-examples. The system then refines the abstract model using the set of cooperative variables.

17 Claims, 3 Drawing Sheets

ABSTRACTION REFINEMENT USING CONTROLLABILITY AND COOPERATIVENESS ANALYSIS

RELATED APPLICATION

This application hereby claims priority under 35 U.S.C. §119 to U.S. Provisional Patent Application No. 60/634,671, filed on 9 Dec. 2004, entitled "Abstraction refinement by controllability and cooperativeness analysis," by inventors Freddy Yiu Chung Mang and Pei-Hsin Ho (Attorney Docket No. 0652P).

BACKGROUND

1. Field of the Invention

The present invention relates to verification of logic designs. More specifically, the present invention relates to formal property verification of logic designs using abstraction refinement.

2. Related Art

Formal property verification exhaustively verifies logic designs against desired properties of the designs with respect to all possible input sequences of any length. An important application of formal verification is to prove safety properties for logic designs. Informally, proving a safety property guarantees that certain "bad" states are not reachable from the initial states through any traces of the design. A counter example of a safety property is a trace that reaches a bad state from an initial state of the design.

Brute force approaches to prove safety properties of logic designs are usually not practical. For example, approaches based on Binary Decision Diagrams (BDD) or clauses in Boolean satisfiability solvers usually cannot verify properties of designs with more than a couple of hundred registers. As a result, formal property verification techniques typically rely on automatic abstraction techniques to verify real-world logic designs.

Abstraction refinement is a popular automatic abstraction method. Abstraction refinement incrementally refines the abstract model, a subset of the design, by including more and more logic from the original design until the underlying formal property verification engine verifies or falsifies the property.

Since the performance of an underlying formal property verification engine decreases as the complexity of the abstract model increases, the biggest challenge of an abstraction refinement algorithm is to buildup an abstract model that is as simple as possible but contains enough details to verify the property.

Unfortunately, prior art techniques for abstraction refinement build abstraction models that are more complex than what is required to prove the safety property, which reduces the performance of the overall verification process.

Hence, what is needed is a method and an apparatus for abstraction refinement that does not build overly complex abstract models.

SUMMARY

One embodiment of the present invention provides a system that refines an abstract model. Note that abstraction refinement is commonly used in formal property verification. During operation, the system receives an abstract model which is a subset of a logic design which can be represented using a set of variables and a set of Boolean functions. Next, the system receives a safety property for the logic design which is desired to be proven. The system also receives a set of counter-examples. A counter-example is a sequence of states that violates the safety property. Note that a state is an assignment of values to the variables, which are determined using the set of Boolean functions and the variable values in the previous state. The system then determines a set of cooperative variables using the set of counter-examples. A cooperative variable is a variable that can help invalidate a counter-example. The system then refines the abstract model using the set of cooperative variables.

In a variation on this embodiment, the system refines the abstract model by first identifying a controlling variable in the set of cooperative variables. A controlling variable is a variable that is likely to invalidate all counter-examples. The system then refines the abstract model using the controlling variable.

In a variation on this embodiment, the system refines the abstract model by adding the Boolean function logic associated with a cooperative variable to the abstract model.

In a variation on this embodiment, the safety property specifies an initial state and a fail variable. Further, a counter-example is a sequence of states which begins with the initial state, and ends with a state in which the fail variable is true. Additionally, the safety property is proven for the logic design if and only if there does not exist a counter-example for the safety property. Moreover, proving the safety property for the abstract model is equivalent to proving the safety property for the logic design.

In a variation on this embodiment, the system determines the set of cooperative variables by performing a 3-value simulation of the abstract model. The set of cooperative variables are ranked and placed in a priority queue during the 3-value simulation. A cooperative variable's rank can depend on: the cooperative variable's frequency of appearance; the number of conflicts that the cooperative variable introduced in the counter-example; the number of registers on a path between the cooperative variable and a fail variable which is specified by the safety property; and the number of inputs that appear in the Binary Decision Diagram (BDD) representation of the transition function associated with the cooperative variable.

DETAILED DESCRIPTION

Integrated Circuit Design Flow

Figure 1:
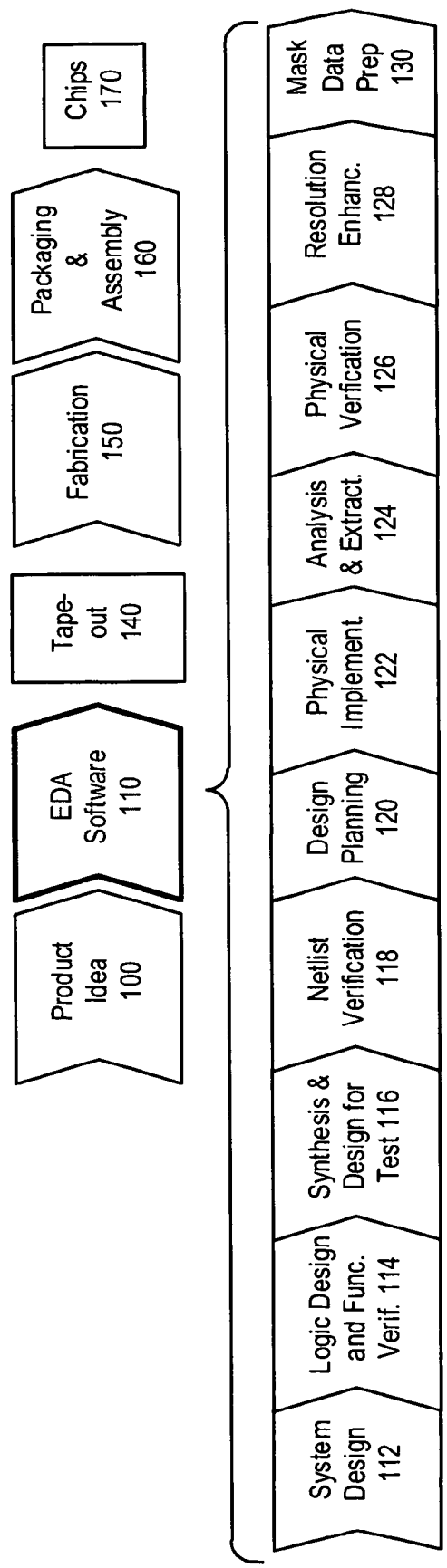
FIG. 1 illustrates an exemplary integrated circuit design flow in accordance with an embodiment of the present invention.

FIG. 1 illustrates an exemplary integrated circuit design flow in accordance with an embodiment of the present invention.

The process starts with the product idea (step 100) which is realized using an EDA software design process (step 110). When the design is finalized, it can be taped-out (event 140). After tape out, the fabrication process (step 150) and packaging and assembly processes (step 160) are performed which ultimately result in finished chips (result 170).

The EDA software design process (step 110), in turn, comprises a number of steps (112-130). Note that the design flow description is for illustration purposes only. Specifically, this description is not meant to limit the present invention. For example, an actual integrated circuit design may require the designer to perform the design steps in a different sequence than the sequence described below. The following text provides a brief description of the steps in the design process (step 110).

System design (step 112): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, does the design as checked to ensure that produces the correct outputs. Exemplary EDA software products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Physical Compiler, Test Compiler, Power Compiler, FPGA Compiler, Tetramax, and DesignWare® products.

Netlist verification (step 118): At this step, the netlist is checked for compliance with timing constraints and for correspondence with the VHDL/Verilog source code. Exemplary EDA software products from Synopsys, Inc. that can be used at this step include Formality, PrimeTime, and VCS products.

Design planning (step 120): Here, an overall floorplan for the chip is constructed and analyzed for timing and top-level routing. Exemplary EDA software products from Synopsys, Inc. that can be used at this step include Astro and IC Compiler products.

Physical implementation (step 122): The placement (positioning of circuit elements) and routing (connection of the same) occurs at this step. Exemplary EDA software products from Synopsys, Inc. that can be used at this step include the Astro and IC Compiler products.

Analysis and extraction (step 124): At this step, the circuit function is verified at a transistor level, this in turn permits what-if refinement. Exemplary EDA software products from Synopsys, Inc. that can be used at this step include AstroRail, PrimeRail, Primetime, and Star RC/XT products.

Physical verification (step 126): At this step various checking functions are performed to ensure correctness for: manufacturing, electrical issues, lithographic issues, and circuitry. Exemplary EDA software products from Synopsys, Inc. that can be used at this step include the Hercules product.

Resolution enhancement (step 128): This step involves geometric manipulations of the layout to improve manufacturability of the design. Exemplary EDA software products from Synopsys, Inc. that can be used at this step include Proteus, ProteusAF, and PSMGen products.

Mask data preparation (step 130): This step provides the "tape-out" data for production of masks for lithographic use to produce finished chips. Exemplary EDA software products from Synopsys, Inc. that can be used at this step include the CATS(R) family of products.

Note that embodiments of the present invention can be used during one or more of the above described steps. Specifically, one embodiment of the present invention can be used during the logic design and functional verification step 114.

Logic Designs and Safety Properties

At a high level, a logic design consists of a collection of inputs, registers and the transition functions of the registers. Formally, a design $D=(V, T)$ is an ordered pair where $V=\{v_1, \ldots, v_n\}$ is a set of Boolean variables and $T=\{t_1, \ldots, t_m\}$ is a set of Boolean functions called the transition functions. A (partial) state s is a Boolean function whose domain is (a subset of) the set V of variables. Each transition function $t_i$ of T maps each state s to a Boolean value and is associated with a distinct variable $v_i$ of V. A variable $v_i$ is called a register if it has a correspondent transition function in T and otherwise an input.

Let $Q(D)$ and $R(D)$ denote respectively the set of inputs and registers of the design D. The relation $\tau(D)=\Lambda_{v_i \in R(D)}(v_i'=t_i)$ is the transition relation of the design D where the primed variables $v_i'$ are the next-state variables of the registers $v_i$. A (partial) trace of the design D is a sequence $\delta=s_0, \ldots, s_k$ such that (1) $s_0, \ldots, s_k$ are (partial) states of D and (2) $\tau(D)(s_i, s_{i+1})$ for each $i=0, \ldots, k-1$. If $\delta=s_0, \ldots, s_k$ is a trace of D, the state $s_k$ is considered reachable from the state $s_0$. Two partial states are consistent if they map each variable in the intersection of their domains to a consistent value.

The union $(s_1, s_2)$ of two consistent partial states is a partial state that maps each variable v in the domain of $s_1$ to $s_1(v)$ and each variable v in the domain of $s_2$ to $s_2(v)$. Two partial traces are consistent if they are of the same length and the corresponding states of the partial traces are consistent.

An (partial) input vector u is a partial state whose domain is (a subset of) the set Q(D) of inputs. An (partial) input trace is a partial trace of (partial) input vectors. For each input trace $\epsilon=u_0, \ldots, u_k$ and starting state so that is consistent with the input vector $u_0$, there is a unique trace $\delta=s_0, \ldots, s_k$ that is consistent with the input trace $\epsilon$. In other words, input trace $\epsilon$ generates the trace $\delta$. A partial trace $\delta$ is valid if there exists a trace that is consistent with the partial trace $\delta$. Otherwise it is invalid. Note that every input trace is valid.

Without loss of generality, a safety property P specifies an initial state $s_a$ and a fail variable $v_f$. A counter example $\delta=s_0, \ldots, s_k$ of a design D for a safety property P is a trace such that $s_0=s_a$ and $s_k(v_f)=1$. A state that maps the fail variable to 1 is called a fail state. The safety property P is True for the design D if and only if there does not exist a counter example of D for the property P. An input trace $\epsilon$ violates the safety property P if $\epsilon$ generates a counter example of D for the property P.

A design $C=(V, T')$ is an abstract model of the design D if the set T' is a subset of the transition functions T of D. In other words, some registers of the design D become inputs of the abstract model C. Clearly, if a property is True for an abstract model of D, the property is also True for the design D.

Controllability and Cooperativeness

It is helpful to define the notion of k-dominancy before explaining k-controllability and k-cooperativeness. Let $C=(V, T')$ be an abstract model of the design D. A subset Q of the inputs of C is k-dominant for the abstract model C and the property P if for any partial input trace $w_0, \ldots, w_k$ of the rest of the inputs $Q(C)\setminus Q$, there exists a partial input trace $u_0, \ldots$ $u_k$ of the inputs Q such that the input trace $(u_0,w_0), \ldots, (u_k,w_k)$ is not consistent with any counter example of C for the property P.

In other words, imagine a game of two players played on the abstract model C, in which player 1 wins if she can control the inputs Q(C)\Q to drive the abstract model to a fail state in k steps and player 2 wins if she can control the inputs Q to steer the abstract model clear of any fail states for k steps. Then player 2 can win if and only if Q is k-dominant.

Second, it is also helpful to define the notion of partitioned abstract models. A partitioned abstract model $(C_c, C_s)=(V, T_c \cup T_s)$ of the design D is an abstract model where $C_c=(V, T_c)$ and $C_s=(V, T_s)$ are also abstract models called respectively the core and the shield. The registers $R(C_s)$ of the shield is a subset of the inputs $Q(C_c)$ of the core. In other words, the registers of the shield drive some inputs of the core.

Figure 2:
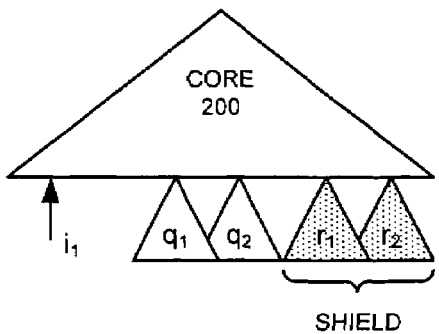
FIG. 2 illustrates a partitioned abstract model in accordance with an embodiment of the present invention.

FIG. 2 illustrates a partitioned abstract model in accordance with an embodiment of the present invention.

Among the five inputs to the core 200, inputs $r_1$ and $r_2$ are driven by the registers of the shield, inputs $q_1$ and $q_2$ are driven by some other registers of the design D and input $i_1$ is an input of D. The triangles represent the transition functions associated with these variables.

Let $C=(C_c, C_s)$ be a partitioned abstract model of a design D. An input $v_i \in (Q(C_c) \cap R(D)) \setminus R(C_s)$ of the core not driven by the shield (e.g., inputs $q_1$ and $q_2$ in FIG. 2) is k-controlling for the partitioned abstract model C if (1) the set $Q(C_c) \cap R(C_s)$ of inputs of the core driven by the shield (e.g., inputs $r_1$ and $r_2$ in FIG. 2) is not k-dominant for the core $C_c$, but (2) the set $\{v_i\} \cup (Q(C_c) \cap R(C_s))$ is k-dominant for the core $C_c$. In the 2 player game scenario, suppose that the players played the game on the core and player 2 was controlling the set of inputs driven by the shield and lost because the set $Q(C_c) \cap R(Cs)$ is not k-dominant. If player 2 gets to pick one additional input to control in a new game, then player 2 will be able to win the new game if and only if she picks a k-controlling input. Note that k-controllability is counter-example independent.

An input $v_i \in (Q(C_c) \cap R(D)) \setminus R(C_s)$ with transition function $t_i$ is k-cooperative for the partitioned abstract model $C=(C_c, C_s)=(V, T')$ and the property P if (1) there is an input trace $\epsilon=u_0, \ldots, u_k$ of C violating the property P and (2) the partial trace $\epsilon$ is invalid on the abstract model $(V, T' \cup \{t_i\})$ Clearly, k-cooperativeness is counter-example dependent.

Note that, on the one hand, the k-controllability estimates the potential of a variable in invalidating counter examples if it was under full control of player 2 (but in reality, the transition function, not player 2, controls the behavior of the variable). On the other hand, the k-cooperativeness demonstrates that the transition function is cooperative with player 2 on invalidating some counter examples. Variables that are both k-controlling and k-cooperative have the potential and seem to be willing to help prove the property. Therefore, the transition functions associated with these variables are good candidates to refine the abstract model.

Process for Verifying a Safety Property Using Abstraction Refinement

Figure 3:
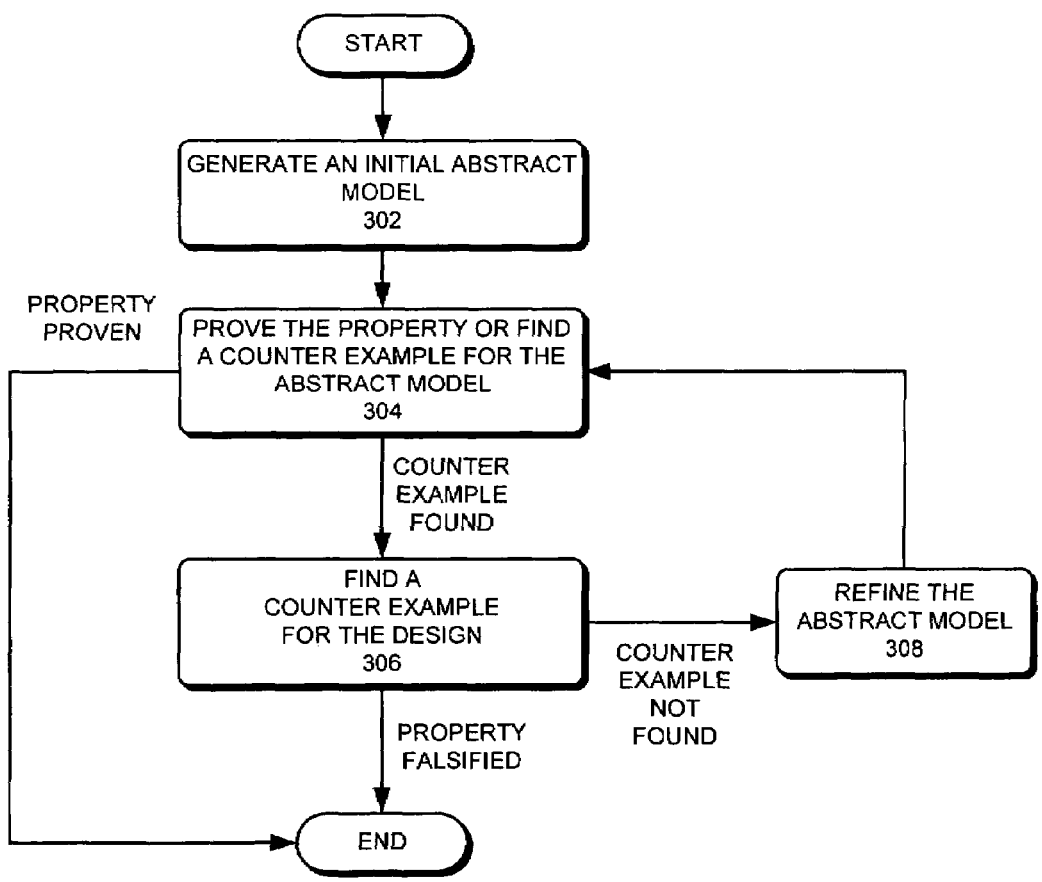
FIG. 3 presents a flowchart that illustrates a process for formal property verification using abstraction refinement in accordance with an embodiment of the present invention.

FIG. 3 presents a flowchart that illustrates a process for formal property verification using abstraction refinement in accordance with an embodiment of the present invention.

The process begins with generating an abstract model for a logic design (step 302).

Next, the system proves the desired safety property for the abstract model or finds a counter example for the abstract model (step 304).

If the system proves the property for the abstract model, the property is also proven for the logic design, and hence the process stops. On the other hand, if the system finds a counter example, the system attempts to find a counter example for the logic design (step 306).

If the system finds a counter example for the logic design, the property is falsified, and the process stops. Otherwise, the system refines the abstract model by adding more details (step 308), and returns to step 304.

Note that the abstraction refinement step 308 is a very important step because it determines whether the property can be proven at step 304 or falsified at step 306. In particular, improving the abstraction refinement step can substantially reduce the amount of computation time required for formal property verification. One embodiment of the present invention provides an improved technique for abstraction refinement.

Computing K-Controllability

Let $C=(V, T')$ be an abstract model, let Q be a subset of inputs of the C, and let $\phi$ be a Boolean formula representing a set of states of the abstract model. The controllable predecessor predicate is defined by the following Boolean predicate: $cpre(\phi)=\forall (Q(C) \setminus Q) \cdot \exists Q \cdot \exists R'(C) \cdot (\tau(C) \wedge \phi')$, where R'(C) is the set of the next-state variables and $\phi'$ is the Boolean formula obtained by substituting all variables in $\phi$ by their corresponding next-state variables.

In other words, the controllable predecessor predicate cpre $((\phi)$ computes a set of states of the abstract model C such that, no matter what values player 1 choose for the inputs Q(C)\Q, player 2 can always choose some values for the inputs Q to transition to some states in $\phi$.

The controllable predecessor predicate can be computed by Binary Decision Diagrams (BDD) operations. To ensure that the set Q of inputs is k-dominant, the controllable predecessor predicate is iteratively computed from the non-fail states as follows. Let $X_0=\neg v_f$. For $i=0, \ldots, k-1$, compute $X_{i+1}=\neg v_f \wedge cpre(X_i)$, which represents the set of states from which player 2 can avoid violating the property P for i steps. Note that the set Q of inputs is k-dominant if and only if $s_a \rightarrow X_k$, where $s_a$ is the initial state of the design D.

A set of inputs is k-dominant if a variable $v_i \in (Q(C_c) \cap R(D)) \setminus R(C_s)$ of a partitioned abstract model $(C_c, C_s)$ is k-controllable. In one embodiment, the system can simplify each predicate $X_i$ by treating the states that are not reachable from the initial state in k-i steps as don't cares in the BDD operations. The predicate that represents the set of reachable states of the abstract model C can be computed by a BDD-based forward image computation from the initial state.

Computing K-Cooperativeness

Given an abstract model C and a partial trace $\delta=s_0, \ldots, s_k$ that represents a set of counter examples of C for P, a subset of the k-cooperative inputs of C can be identified by performing 3-value simulation on the design. The advantage of 3-value simulation is that the runtime is linear in the size of the design times the length k of the partial trace. The unknown value X is used to over approximate the value of a variable that is of value either 0 or 1. As a result, the process may not identify all k-cooperative inputs.

In one embodiment, the system arranges the design so that the registers and inputs of the design are on the left and the next-state registers are on the right. At the i-th step of the 3-value simulation, for each $i=0, \ldots, k-1$, the system (1) drives the registers and inputs v on the left with $s_i(v)$ if v is in the domain of $s_i$ and with the unknown value X if v is not in the domain of $s_i$, (2) performs 3-value simulation on the design to compute a partial state $s_i'+1$ of the next-state variables on the right, and (3) records the conflict variables, variables $v_i \in (Q(C_c) \cap R(D)) \setminus R(C_s)$ that have conflicting values (the unknown value X does not conflict with any value) between the partial states $s_i'+1$ and $s_i+1$. It is clear that the following theorem is true. Note that, if a variable $v_i \in (Q(C_c) \cap R(D)) \setminus R(C_s)$ has conflicting values in the result $s_i'+1$ of the $i^{th}$ cycle of 3-value simulation and the next partial state $s_i+1$ of the counter example, then the variable v is k-cooperative.

The k-cooperative variables are ranked and placed in a priority queue first by their frequencies of appearances, the number of conflicts that they introduced in the counter example (the higher the better); then by sequential distances, the least number of registers on a path between the variable and the fail variable (the less the better); and finally by input widths, the number of inputs that appear in the BDD representation of the transition function of the variable (the fewer the better). This priority queue can be used in the abstraction refinement process described below.

Process for Refining an Abstract Model

Figure 4:
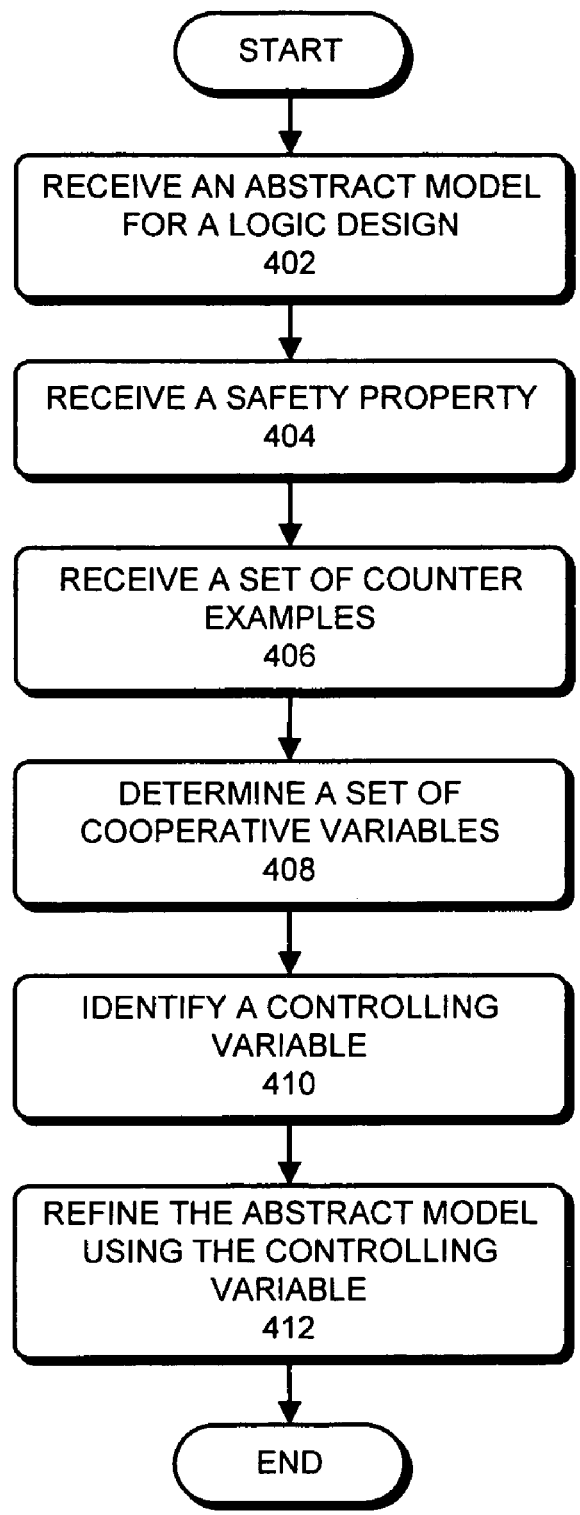
FIG. 4 presents a flowchart that illustrates a process for refining an abstract model in accordance with an embodiment of the present invention.

FIG. 4 presents a flowchart that illustrates a process for refining an abstract model in accordance with an embodiment of the present invention.

The process begins by receiving an abstract model (step 402).

Next, the system receives a safety property (step 404).

The system then receives a set of counter-examples (step 406).

A set of counter examples for the abstract model C can be represented by a partial trace $\delta = s_0, \ldots, s_k$ of length k. The abstract model $C=(C_c, C_s)$ is maintained in the form of a partitioned abstract model. Exactly one transition function is selected to be included in the abstract model in every iteration of the abstraction refinement algorithm. Note that this differs from the process used in D. Wang, P.-H. Ho, J. Long, J. Kukula, Y. Zhu, H.-K. T. Ma, and R. Damiano, "Formal property verification by abstraction refinement with formal, simulation and hybrid engines," Proceedings of DAC, pp. 35-40, 2001 (henceforth "Wang-2001"). The process in Wang-2001 adds multiple transition functions in an iteration.

Next, the system determines a set of cooperative variables using the set of counter-examples, wherein a cooperative variable is a variable that can help invalidate a counter-example (step 408).

First, a priority queue of the k-cooperative variables is built using the 3-value simulation method. If the queue is empty, a netlist-topology based breadth-first-search (BFS) method is applied to select an input of the core that is not driven by the shield as our variable for refinement (further details of how to do this can be found in P.-H. Ho, T. Shiple, K. Harer, J. Kukula, R. Damiano, V. Bertacco, J. Taylor, and J. Long, "Smart Simulation Using Collaborative Formal and Simulation Engines," Proceedings of ICCAD, pp. 120-126, 2000). The transition function of the chosen variable can then be added to the shield of the abstract model.

The system then identifies a controlling variable in the set of cooperative variables (step 410). Recall that a controlling variable is a variable that is likely to invalidate a counter-example. Specifically, in one embodiment, a controlling variable is a variable that is likely to invalidate all counter-examples.

In one embodiment the system searches for a k-controlling variable among the first three variables in the queue using the BDD-based method. The first k-controlling variable of the top three k-cooperative variables becomes our variable for refinement.

The system then refines the abstract model using the controlling variable (step 412).

Specifically the system adds the transition function of the controlling variable to the shield of the abstract model.

Note that a loop invariant must be maintained during the abstraction refinement iterations: the set of inputs of the core driven by the shield is not k-dominant for the core. Without this loop invariant, every input of the core not driven by the shield might become k-controlling in the next iteration of the abstraction refinement algorithm. To maintain the loop invariant, after including a k-controlling variable into the shield, the "oldest" variables (the variables that were included first) of the shield are moved one-by-one into the core, until the set of inputs of the core driven by the shield is no longer k-dominant. If a k-controlling variable is not found among the first three k-cooperative variables, the head of the priority queue (which is a k-cooperative variable) is added to the shield of the abstract model. Note that the process could have searched deeper in the priority queue for k-controlling variables. However, since k-controllability analysis requires non-trivial BDD operations, checking only the first three variables in the priority queue for k-controllability makes a good tradeoff.

The method described in C. Wang, B. Li, H. Jin, G. D. Hachtel, F. Somenzi, "Improving Ariadne's bundle by following multiple threads in abstraction refinement," Proceedings of ICCAD, pp. 408-415, 2003 (henceforth "Wang-2003"), picks the refinement variables by analyzing all shortest counter examples represented as a sequence of BDDs called synchronous onion rings (SORs). The method of Wang-2003 scores each design register that is an input of the abstract model based on a game-theoretic formula that estimates how many transitions within the SOR the variable can invalidate if it was under the control of player 2. The abstract model is then augmented with the variables with the highest scores until the whole set of SORs is invalidated.

The major differences between the present invention and Wang-2003 are: (1) a k-controlling variable may not get the highest score from the game-theoretic formula used in Wang-2003 and the variable getting the highest score may not be a k-controlling variable, (2) the k-controllability analysis is independent of the SORs and (3) the method of Wang-2003 does not try to analyze the rest of the design as what k-cooperativeness analysis does using 3-value simulation.

Note that a number of modifications to the present invention are possible. For example, the present invention can (1) use more efficient k-controllability analysis and more accurate k-cooperativeness analysis and (2) use Wang-2003's game-theoretic formula to rank a subset of the k-cooperative variables in the priority queue when no k-controllable variable is found.

CONCLUSION

The data structures and code described in the foregoing description are typically stored on a computer-readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Furthermore, the foregoing descriptions of embodiments of the present invention have been presented only for purposes of illustration and description. They are not intended to be exhaustive or to limit the present invention to the forms disclosed. Accordingly, many modifications and variations will be readily apparent to practitioners skilled in the art. Additionally, the above disclosure is not intended to limit the present invention. The scope of the present invention is defined by the appended claims.

What is claimed is:

1. A method for refining an abstract model, the method comprising:
   receiving an abstract model which is a subset of a logic design, wherein the abstract model is represented using a set of variables and a set of Boolean functions;
   receiving a safety property for the logic design which is desired to be proven;
   receiving a set of counter-examples, wherein a counter-example is a sequence of states that violates the safety property, wherein a state is an assignment of values to the variables, wherein the variable values are determined using the set of Boolean functions and the variable values in the previous state;
   determining a set of cooperative variables using the set of counter-examples, wherein a cooperative variable is a variable that helps invalidate a counter-example; and
   refining the abstract model using the set of cooperative variables;
   wherein the safety property specifies an initial state and a fail variable;
   wherein a counter-example is a sequence of states which begins with the initial state, and ends with a state in which the fail variable is true;
   wherein the safety property is proven for the logic design if and only if there does not exist a counter-example for the safety property; and
   wherein proving the safety property for the abstract model is equivalent to proving the safety property for the logic design.

2. The method of claim 1, wherein the method is used during a formal property verification process.

3. The method of claim 1, wherein refining the abstract model involves:
   identifying a controlling variable in the set of cooperative variables, wherein a controlling variable is a variable that helps invalidate all counter examples; and
   refining the abstract model using the controlling variable.

4. The method of claim 1, wherein refining the abstract model involves adding the Boolean function logic associated with a cooperative variable to the abstract model.

5. The method of claim 1, wherein determining the set of cooperative variables involves performing a 3-value simulation of the abstract model.

6. The method of claim 5, wherein the set of cooperative variables are ranked and placed in a priority queue during the 3-value simulation, wherein a cooperative variable's rank depends on:
   the cooperative variable's frequency of appearance; the number of conflicts that the cooperative variable introduced in the counter-example;
   the number of registers on a path between the cooperative variable and a fail variable which is specified by the safety property; and
   the number of inputs that appear in the Binary Decision Diagram (BDD) representation of the transition function associated with the cooperative variable.

7. A computer-readable storage device storing instructions that when executed by a computer cause the computer to perform a method for refining an abstract model, the method comprising:
   receiving an abstract model which is a subset of a logic design, wherein the abstract model is represented using a set of variables and a set of Boolean functions;
   receiving a safety property for the logic design which is desired to be proven;
   receiving a set of counter-examples, wherein a counter-example is a sequence of states that violates the safety property, wherein a state is an assignment of values to the variables, wherein the variable values are determined using the set of Boolean fUnctions and the variable values in the previous state;
   determining a set of cooperative variables using the set of counter-examples, wherein a cooperative variable is a variable that helps invalidate a counter-example; and
   refining the abstract model using the set of cooperative variables;
   wherein the safety property specifies an initial state and a fail variable;
   wherein a counter-example is a sequence of states which begins with the initial state, and ends with a state in which the fail variable is tme;
   wherein the safety property is proven for the logic design if and only if there does not exist a counter-example for the safety property; and
   wherein proving the safety property for the abstract model is equivalent to proving the safety property for the logic design.

8. The computer-readable storage medium of claim 7, wherein the method is used during a formal property verification process.

9. The computer-readable storage medium of claim 7, wherein refining the abstract model involves:
   identifying a controlling variable in the set of cooperative variables, wherein a controlling variable is a variable that helps invalidate all counter examples; and
   refining the abstract model using the controlling variable.

10. The computer-readable storage medium of claim 7, wherein refining the abstract model involves adding the Boolean function logic associated with a cooperative variable to the abstract model.

11. The computer-readable storage device of claim 7, wherein determining the set of cooperative variables involves performing a 3-value simulation of the abstract model.

12. The computer-readable storage device of claim 11, wherein the set of cooperative variables are ranked and placed in a priority queue during the 3-value simulation, wherein a cooperative variable's rank depends on:
   the cooperative variable's frequency of appearance;
   the number of conflicts that the cooperative variable introduced in the counter-example;
   the number of registers on a path between the cooperative variable and a fail variable which is specified by the safety property; and
   the number of inputs that appear in the Binary Decision Diagram (BDD) representation of the transition function associated with the cooperative variable.

13. An apparatus for refining an abstract model, the apparatus comprising:
   a first receiving mechanism configured to receive an abstract model which is a subset of a logic design, wherein the abstract model is represented using a set of variables and a set of Boolean functions;
   a second receiving mechanism configured to receive a safety property for the logic design which is desired to be proven;
   a third receiving mechanism configured to receive a set of counter-examples, wherein a counter-example is a sequence of states that violates the safety property, wherein a state is an assignment of values to the variables, wherein the variable values are determined using the set of Boolean functions and the variable values in the previous state;

a determining mechanism configured to determine a set of cooperative variables using the set of counter-examples, wherein a cooperative variable is a variable that helps invalidate a counter-example; and a refining mechanism configured to refine the abstract model using the set of cooperative variables;

wherein the safety property specifies an initial state and a fail variable;

wherein a counter-example is a sequence of states which begins with the initial state, and ends with a state in which the fail variable is true;

wherein the safety property is proven for the logic design if and only if there does not exist a counter-example for the safety property; and wherein proving the safety property for the abstract model is equivalent to proving the safety property for the logic design.

14. The apparatus of claim 13, wherein the apparatus operates during a formal property verification process.

15. The apparatus of claim 13, wherein the refining mechanism is configured to:
identify a controlling variable in the set of cooperative variables, wherein a controlling variable is a variable that helps invalidate all counter examples; and to
refine the abstract model using the controlling variable.

16. The apparatus of claim 13, wherein the refining mechanism is configured to add the Boolean function logic associated with a cooperative variable to the abstract model.

17. The apparatus of claim 13, wherein the determining mechanism is configured to perform a 3-value simulation of the abstract model, wherein the set of cooperative variables are ranked and placed in a priority queue during the 3-value simulation, wherein a cooperative variable's rank depends on:
the cooperative variable's frequency of appearance; the number of conflicts that the cooperative variable introduced in the counter-example;
the number of registers on a path between the cooperative variable and a fail variable which is specified by the safety property; and
the number of inputs that appear in the Binary Decision Diagram (BDD) representation of the transition function associated with the cooperative variable.

* * * * *

UNITED STATES PATENT AND TRADEMARK OFFICE
CERTIFICATE OF CORRECTION

PATENT NO. : 7,469,392 B2
APPLICATION NO. : 11/298120
DATED : December 23, 2008
INVENTOR(S) : Yiu Chung Mang et al.

It is certified that error appears in the above-identified patent and that said Letters Patent is hereby corrected as shown below:

In claim 7 (column 10, line 10), please change the word "fUnctions" to the word --functions--.
      In claim 7 (column 10, line 21), please change the word "tme" to the word --true--.
      In claim 8 (column 10, line 28), please change the word "medium" to the word --device--.
      In claim 9 (column 10, line 31), please change the word "medium" to the word --device--.
      In claim 10 (column 10, line 37), please change the word "medium" to the word --device--.

Signed and Sealed this

Seventeenth Day of February, 2009

JOHN DOLL
*Acting Director of the United States Patent and Trademark Office*